United States Patent
Ebiike

(10) Patent No.: US 10,164,083 B2
(45) Date of Patent: Dec. 25, 2018

(54) SILICON CARBIDE SEMICONDUCTOR DEVICE AND MANUFACTURING METHOD THEREFOR

(71) Applicant: Mitsubishi Electric Corporation, Tokyo (JP)

(72) Inventor: Yuji Ebiike, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/511,424

(22) PCT Filed: Jan. 7, 2015

(86) PCT No.: PCT/JP2015/050245
§ 371 (c)(1),
(2) Date: Mar. 15, 2017

(87) PCT Pub. No.: WO2016/110953
PCT Pub. Date: Jul. 14, 2016

(65) Prior Publication Data
US 2017/0301783 A1    Oct. 19, 2017

(51) Int. Cl.
*H01L 29/78* (2006.01)
*H01L 29/16* (2006.01)
(Continued)

(52) U.S. Cl.
CPC .......... *H01L 29/78* (2013.01); *H01L 29/0634* (2013.01); *H01L 29/0653* (2013.01);
(Continued)

(58) Field of Classification Search
CPC ... H01L 29/78; H01L 29/41725; H01L 29/47; H01L 29/66068
See application file for complete search history.

(56) References Cited

U.S. PATENT DOCUMENTS

| | | | |
|---|---|---|---|
| 4,689,647 A | 8/1987 | Nakagawa et al. | |
| 5,086,324 A | 2/1992 | Hagino | |

(Continued)

FOREIGN PATENT DOCUMENTS

| | | |
|---|---|---|
| JP | S61-015370 A | 1/1986 |
| JP | H02-126682 A | 5/1990 |

(Continued)

OTHER PUBLICATIONS

International Search Report issued in PCT/JP2015/050245; dated Feb. 10, 2015.

(Continued)

*Primary Examiner* — Julia Slutsker
(74) *Attorney, Agent, or Firm* — Studebaker & Brackett PC

(57) ABSTRACT

A silicon carbide semiconductor device includes an ohmic electrode and a Schottky electrode that are in contact with the drain electrode respectively on the drain electrode and are next to each other; a first conductivity type first withstand voltage holding region in contact with the ohmic electrode on the ohmic electrode; a second conductivity type second withstand voltage holding region in contact with the Schottky electrode on the Schottky electrode and is next to the first withstand voltage holding region; a second conductivity type well region in contact onto the first and second withstand voltage holding regions; a first conductivity type source region selectively provided on a surface layer of the well region; and a gate electrode opposite to a channel region defined by the well region sandwiched between the source region and the first withstand voltage holding region, with a gate oxide film interposed therebetween.

6 Claims, 7 Drawing Sheets

(51) Int. Cl.
  *H01L 29/417* (2006.01)
  *H01L 29/45* (2006.01)
  *H01L 29/47* (2006.01)
  *H01L 29/66* (2006.01)
  *H01L 29/06* (2006.01)
  *H01L 29/08* (2006.01)
  *H01L 29/10* (2006.01)
  *H01L 29/872* (2006.01)

(52) U.S. Cl.
  CPC ...... *H01L 29/0878* (2013.01); *H01L 29/0886* (2013.01); *H01L 29/1095* (2013.01); *H01L 29/1608* (2013.01); *H01L 29/41725* (2013.01); *H01L 29/41741* (2013.01); *H01L 29/45* (2013.01); *H01L 29/47* (2013.01); *H01L 29/66068* (2013.01); *H01L 29/7806* (2013.01); *H01L 29/872* (2013.01)

(56) References Cited

U.S. PATENT DOCUMENTS

| | | |
|---|---|---|
| 5,171,696 A | 12/1992 | Hagino |
| 6,323,509 B1 | 11/2001 | Kusunoki |
| 6,605,830 B1 | 8/2003 | Kusunoki |
| 8,410,489 B2 | 4/2013 | Adachi et al. |
| 8,617,936 B2 | 12/2013 | Rahimo et al. |
| 9,419,117 B2 | 8/2016 | Aketa et al. |
| 2008/0179671 A1 | 7/2008 | Saito et al. |
| 2009/0108303 A1* | 4/2009 | Pfirsch ............ H01L 29/0634 257/287 |
| 2016/0343803 A1 | 11/2016 | Aketa et al. |

FOREIGN PATENT DOCUMENTS

| | | |
|---|---|---|
| JP | 2000-200906 A | 7/2000 |
| JP | 2008-187125 A | 8/2008 |
| JP | 2011-9387 A | 1/2011 |
| JP | 2011-507300 A | 3/2011 |
| JP | 4918626 B2 | 4/2012 |
| JP | 2013-110373 A | 6/2013 |
| WO | 2009/077588 A1 | 6/2009 |

OTHER PUBLICATIONS

JP Office Action dated Oct. 3, 2017, from corresponding JP Appl No. 2016-568204, with English translation, 8 pp.

* cited by examiner

F I G . 1
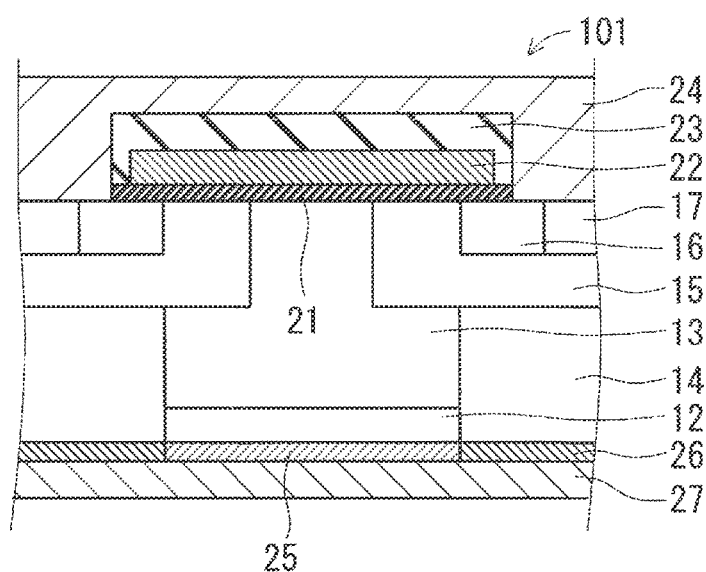
F I G . 2
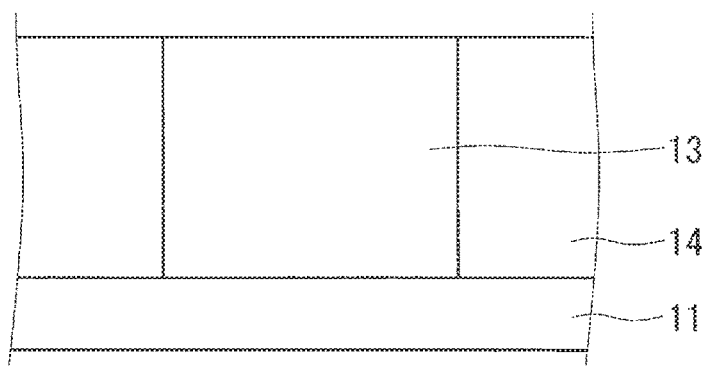

F I G . 3
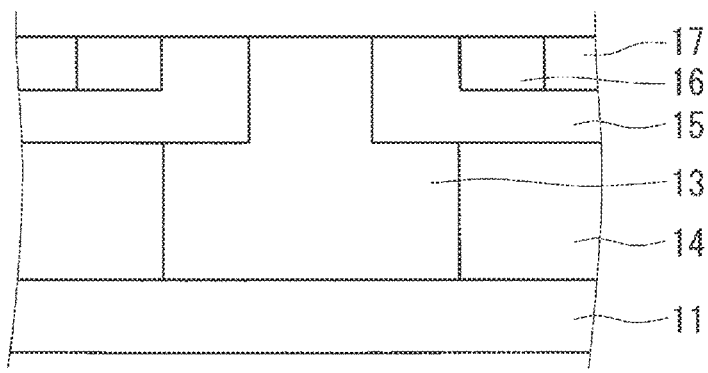
F I G . 4
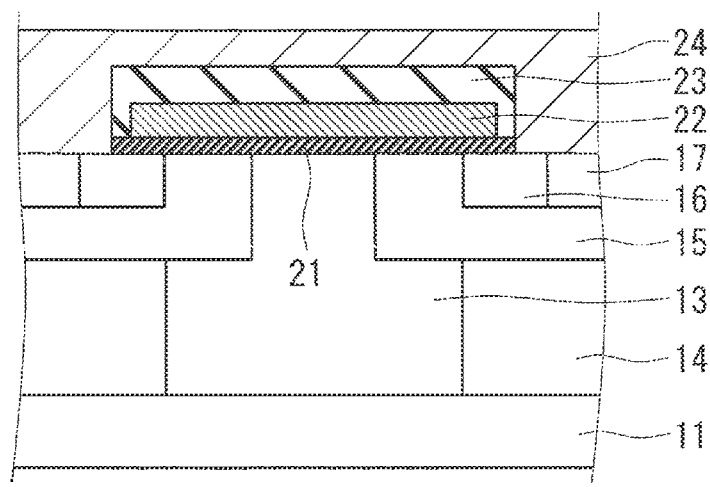

F I G . 1 3
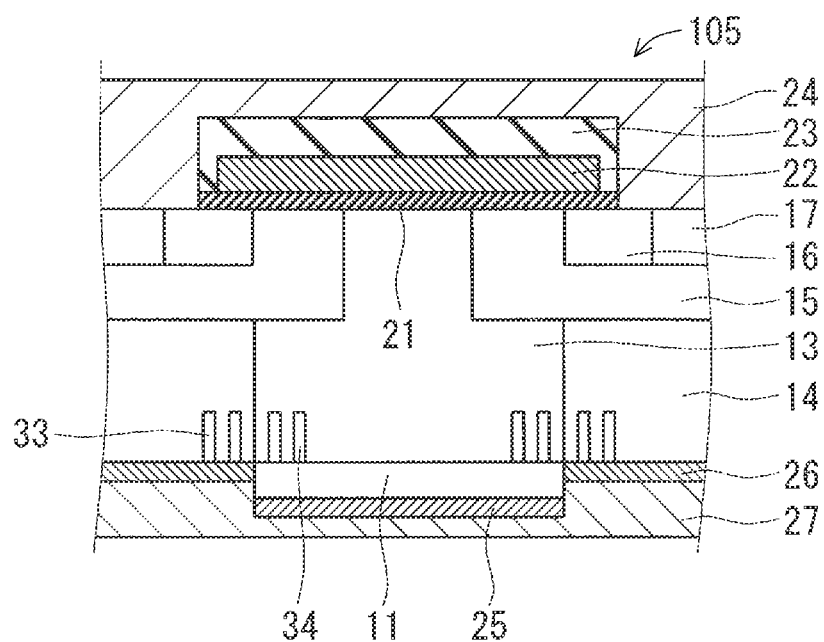

000
SILICON CARBIDE SEMICONDUCTOR DEVICE AND MANUFACTURING METHOD THEREFOR

TECHNICAL FIELD

The present invention relates to a silicon carbide semiconductor device and a manufacturing method for the silicon carbide semiconductor device.

BACKGROUND ART

For energy saving of power electronics devices such as an inverter, it is necessary to reduce a loss in semiconductor switching elements such as an insulated gate bipolar transistor (IGBT) and a metal-oxide-semiconductor field-effect transistor (MOSFET).

The loss in a semiconductor switching element is determined by a conduction loss or a switching loss of the element. Therefore, in order to reduce these losses, development has been promoted in which wide band gap semiconductors such as silicon carbide (SiC) and gallium nitride (GaN) are used as materials.

With use of a power MOSFET as a switching element, a reflux current can be flowed in a parasitic diode (hereinafter, referred to as a body diode in the present specification) of the power MOSFET. The use of the body diode enables compactification or omission of a reflux diode disposed in parallel with the switching element, and therefore, this technique has been applied to power converter circuits.

There is, however, a problem that bipolar operation of a SiC semiconductor element with use of p-type and n-type carriers expands a crystal defect by recombination energy of the carriers to increase resistance. This problem is generated also in the above-mentioned case of flowing a reflux current in the body diode, leading to problems such as an increase in the loss and malfunction that are caused by an increase in ON-resistance.

In order to solve this problem, Patent Document 1 discloses a structure in which a gate voltage is applied to a channel portion to flow a reflux current during reflux in a SiC-MOSFET to suppress the defect expansion caused by the bipolar operation, so that the increase in the ON-resistance is suppressed. According to this semiconductor device, an increase of the gate voltage to 0 V or more and a threshold voltage or less allows a flow of a reflux current through the channel of the SiC-MOSFET, so that a current can be refluxed with a voltage smaller than necessary for activating the body diode to suppress the bipolar operation.

PRIOR ART DOCUMENT

Patent Document

Patent Document 1: Japanese Patent No. 4918626

SUMMARY OF INVENTION

Problem to be Solved by the Invention

It is important in a SiC-MOSFET not to operate a body diode during reflux to secure the stability of an element. With a structure of allowing the reflux with use of a channel region as in Patent Document 1, the reflux is available without operating a body diode, enabling securement of the stability of an element.

In the semiconductor device of Patent Document 1, however, the gate voltage is controlled in a narrow range from 0 V to a threshold voltage (both inclusive) during reflux, and therefore, it is considered that application of noise to a gate easily opens a channel portion to generate a through-current from a drain to a source.

In view of the above-mentioned problem, an object of the present invention is to enable the reflux without operating a body diode in a SiC-MOSFET.

Means for Solving the Problem

A silicon carbide semiconductor device of the present invention includes a drain electrode; an ohmic electrode and a Schottky electrode that are in contact with the drain electrode on the drain electrode and that are next to each other; a first conductivity type first withstand voltage holding region in contact with the ohmic electrode on the ohmic electrode; a second conductivity type second withstand voltage holding region that is in contact with the Schottky electrode on the Schottky electrode and is next to the first withstand voltage holding region; a second conductivity type well region in contact onto the first withstand voltage holding region and the second withstand voltage holding region; a first conductivity type source region selectively provided on a surface layer of the well region; and a gate electrode opposite to a channel region defined by the well region sandwiched between the source region and the first withstand voltage holding region, with a gate oxide film interposed therebetween.

According to a first manufacturing method for a silicon carbide semiconductor device of the present invention, a first conductivity type first withstand voltage holding region and a second conductivity type second withstand voltage holding region are formed next to each other on a first conductivity type SiC substrate, a second conductivity type well region is formed in contact with the first withstand voltage holding region and the second withstand voltage holding region, a first conductivity type source region is selectively formed on a surface layer of the well region, a gate electrode is formed opposite to a channel region defined by the well region sandwiched between the source region and the first withstand voltage holding region, with a gate oxide film interposed therebetween, the SiC substrate is removed to expose the first withstand voltage holding region and the second withstand voltage holding region, an ohmic electrode is formed in contact with an exposed surface of the first withstand voltage holding region, and a Schottky electrode is formed in contact with an exposed surface of the second withstand voltage holding region.

According to a second manufacturing method for a silicon carbide semiconductor device of the present invention, a first conductivity type first withstand voltage holding region and a second conductivity type second withstand voltage holding region are formed next to each other on a first conductivity type SiC substrate, a second conductivity type well region is formed in contact with the first withstand voltage holding region and the second withstand voltage holding region, a first conductivity type source region is selectively formed on a surface layer of the well region, a gate electrode is formed opposite to a channel region defined by the well region sandwiched between the source region and the first withstand voltage holding region, with a gate oxide film interposed therebetween, the SiC substrate is selectively removed not to expose the first withstand voltage holding region but to expose the second withstand voltage holding region, an ohmic electrode is formed in contact with the SiC substrate, and a Schottky electrode is formed in contact with an exposed surface of the second withstand voltage holding region.

Effects of the Invention

A silicon carbide semiconductor device of the present invention includes a drain electrode; an ohmic electrode and a Schottky electrode that are in contact with the drain electrode on the drain electrode and that are next to each other; a first conductivity type first withstand voltage holding region in contact with the ohmic electrode on the ohmic electrode; a second conductivity type second withstand voltage holding region that is in contact with the Schottky electrode on the Schottky electrode and is next to the first withstand voltage holding region; a second conductivity type well region in contact onto the first withstand voltage holding region and the second withstand voltage holding region; a first conductivity type source region selectively provided on a surface layer of the well region; and a gate electrode opposite to a channel region defined by the well region sandwiched between the source region and the first withstand voltage holding region, with a gate oxide film interposed therebetween. Thus, since the silicon carbide semiconductor device of the present invention has a structure in which a SiC-SBD and a SiC-MOSFET are connected in parallel, it is possible to suppress defect expansion by flowing a reflux current not in a body diode of the MOSFET but in the SBD.

According to a first manufacturing method for a silicon carbide semiconductor device of the present invention, a first conductivity type first withstand voltage holding region and a second conductivity type second withstand voltage holding region are formed next to each other on a first conductivity type SiC substrate, a second conductivity type well region is formed in contact with the first withstand voltage holding region and the second withstand voltage holding region, a first conductivity type source region is selectively formed on a surface layer of the well region, a gate electrode is formed opposite to a channel region defined by the well region sandwiched between the source region and the first withstand voltage holding region, with a gate oxide film interposed therebetween, the SiC substrate is removed to expose the first withstand voltage holding region and the second withstand voltage holding region, an ohmic electrode is formed in contact with an exposed surface of the first withstand voltage holding region, and a Schottky electrode is formed in contact with an exposed surface of the second withstand voltage holding region. Thus, the silicon carbide semiconductor device can be formed as a parallel connection structure of a SiC-MOSFET and a SiC-SBD to allow a reflux current to be flowed not in a body diode of the MOSFET but in the SBD, so that the defect expansion can be prevented.

According to a second manufacturing method for a silicon carbide semiconductor device of the present invention, a first conductivity type first withstand voltage holding region and a second conductivity type second withstand voltage holding region are formed next to each other on a first conductivity type SiC substrate, a second conductivity type well region is formed in contact with the first withstand voltage holding region and the second withstand voltage holding region, a first conductivity type source region is selectively formed on a surface layer of the well region, a gate electrode is formed opposite to a channel region defined by the well region sandwiched between the source region and the first withstand voltage holding region, with a gate oxide film interposed therebetween, the SiC substrate is selectively removed not to expose the first withstand voltage holding region but to expose the second withstand voltage holding region, an ohmic electrode is formed in contact with the SiC substrate, and a Schottky electrode is formed in contact with an exposed surface of the second withstand voltage holding region. Thus, the silicon carbide semiconductor device can be formed as a parallel connection structure of a SiC-MOSFET and a SiC-SBD to allow a reflux current to be flowed not in a body diode of the MOSFET but in the SBD, so that the defect expansion can be prevented. Further, the ohmic electrode is brought into contact with use of the SiC substrate, making an ion injection step for forming a contact region unnecessary.

An object, a feature, a form, and an advantage of the present invention are made clearer by the following detailed description and drawings attached.

BRIEF DESCRIPTION OF DRAWINGS

FIG. 1 is a sectional view showing a configuration of a silicon carbide semiconductor device according to an embodiment 1.

FIG. 2 is a sectional view showing a manufacturing step of the silicon carbide semiconductor device according to the embodiment 1.

FIG. 3 is a sectional view showing a manufacturing step of the silicon carbide semiconductor device according to the embodiment 1.

FIG. 4 is a sectional view showing a manufacturing step of the silicon carbide semiconductor device according to the embodiment 1.

FIG. 13 is a sectional view showing a configuration of a silicon carbide semiconductor device according to an embodiment 5.

DESCRIPTION OF EMBODIMENTS

A. Embodiment 1

A-1. Configuration

Figure 5:
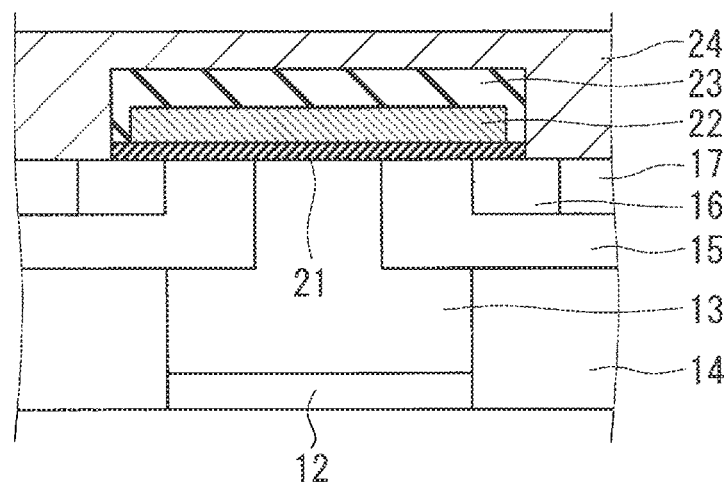
FIG. 5 is a sectional view showing a manufacturing step of the silicon carbide semiconductor device according to the embodiment 1.

FIG. 1 is a sectional view showing a configuration of a silicon carbide semiconductor device 101 according to an embodiment 1. The silicon carbide semiconductor device 101 includes an n-channel type SiC-MOSFET. The present invention, however, is also applicable to a p-channel type SiC-MOSFET.

The silicon carbide semiconductor device 101 includes a drain electrode 27, an ohmic electrode 25, a contact region 12, a withstand voltage holding region 13, a well region 15, a source region 16, a well contact region 17, a gate oxide film 21, a gate electrode 22, an interlayer insulating film 23, a source electrode 24, a Schottky electrode 26, and a withstand voltage holding region 14.

On the drain electrode 27 are formed the ohmic electrode 25 and the Schottky electrode 26 alternately in surface direction of the drain electrode. On the ohmic electrode 25 are formed the n-type contact region 12 and the n-type withstand voltage holding region 13 in this order, and the ohmic electrode 25 is in ohmic contact with the withstand voltage holding region 13 with the contact region 12 interposed therebetween. The withstand voltage holding region 13 also serves as a drift region in which a current is flowed during ON-time.

On the Schottky electrode 26 is formed the p-type withstand voltage holding region 14, and the Schottky electrode 26 is in Schottky contact with the withstand voltage holding region 14. Accordingly, the withstand voltage holding region 14 and the withstand voltage holding region 13 are disposed in a direction parallel with a main surface of the drain electrode 27, specifically, disposed alternately in the horizontal direction in FIG. 1. As a method for alternate disposition, for example, a method of disposition in stripes is considered, however, other disposition methods can also be used as long as the methods do not adversely affect withstand voltage holding and electrification.

The p-type well region 15 is formed in contact with the withstand voltage holding regions 13 and 14. On a surface layer of the well region 15 is selectively formed the n-type source region 16, and in the center of the source region 16 is formed the p-type well contact region 17 penetrating a front surface to a rear surface of the source region. The well contact region 17 is provided so as to equalize electric potentials of the source region 16 and the well region 15, so that switching characteristics are stabilized.

On a part of the source region 16 as well as the well region 15 and the withstand voltage holding region 13 is formed the gate electrode 22 with the gate oxide film 21 interposed therebetween. On the gate electrode 22 is formed the interlayer insulating film 23 and is formed the source electrode 24 in such a manner as to be insulated from the gate electrode 22 through the interlayer insulating film 23. The source electrode 24 is in contact with the source region 16 and the well contact region 17. Here, a planar gate structure is shown, however, the present invention is also applicable to a trench gate structure.

Thus, the silicon carbide semiconductor device 101 has a structure in which an n-type SiC-MOSFET and a p-type SiC-SBD are connected in parallel. Specifically, the SiC-MOSFET includes the drain electrode 27, the ohmic electrode 25, the contact region 12, the withstand voltage holding region 13, the well region 15, the source region 16, the well contact region 17, the gate oxide film 21, the gate electrode 22, the interlayer insulating film 23, and the source electrode 24. The SiC-SBD includes the drain electrode 27, the Schottky electrode 26, the withstand voltage holding region 14, the well region 15, the well contact region 17, and the source electrode 24.

A-2. Operation

Operation of the silicon carbide semiconductor device 101 is described.

When a positive voltage is applied to the gate electrode 22, a channel as a current path is formed in a region of the well region 15 opposite to the gate electrode 22 with the gate oxide film 21 interposed therebetween.

When a positive voltage is applied to the drain electrode 27 in this state, a current flows from the drain electrode 27 to the source electrode 24 via the n-type withstand voltage holding region 13, the channel of the well region 15, and the source region 16.

On the other hand, the channel is removed by removing the positive voltage from the gate electrode 22 or applying a negative voltage to the gate electrode 22. Therefore, even when a high voltage is applied to the drain electrode 27, the current between the drain electrode 27 and the source electrode 24 can be blocked.

Next considered is a reflux current, i.e., a case in which a current flows from the source electrode 24 to the drain electrode 27 with use of the semiconductor device 101. A current flows from the source electrode 24 to the drain electrode 27 via the well contact region 17, the well region 15, the p-type withstand voltage holding region 14, and the Schottky electrode 26. This is a state in which the p-type SiC-SBD is operated.

When the voltage between the source electrode 24 and the drain electrode 27 increases to about 2.7 V or more, the well region 15 and the n-type withstand voltage holding region 13 operate as a PN diode. When this PN diode operates, the above-mentioned defect expansion is generated in the withstand voltage holding region 13, possibly causing failures such as an increase in an ON-voltage. Therefore, the ON-voltage of the p-type SiC-SBD can be designed to, for example, about 0.8 to 2.5 V to prevent the above-mentioned operation of the PN diode and therefore the defect expansion and failures attributed to the defect expansion.

Particularly, in a semiconductor device including a wide band gap semiconductor such as SiC, a current for activating the PN diode becomes large, and therefore, the application of the structure of the semiconductor device of the present invention is very effective for suppressing the operation of the PN diode.

A-3. Manufacturing Steps

Next, a manufacturing method for the silicon carbide semiconductor device 101 is described along with FIGS. 2 to 5. The manufacturing method described below, however, is an example, and a procedure and the like may be changed within a range of not adversely affecting the effects of the present invention.

First, an n-type low resistance SiC substrate 11 is prepared, and the n-type withstand voltage holding region 13 and the p-type withstand voltage holding region 14 are formed on the SiC substrate 11 as shown in FIG. 2. The withstand voltage holding regions 13 and 14 can be formed by, for example, performing epitaxial growth and ion injection once or a plurality of times. The configuration of FIG. 2 can also be made by forming the withstand voltage holding region 13 through epitaxial growth, then selectively removing the withstand voltage holding region 13, and forming the p-type withstand voltage holding region 14 through epitaxial grown in the region removed. The impurity concentration of the n-type SiC substrate 11 is, for example, $1 \times 10^{18}$ cm$^{-3}$ to $1 \times 10^{21}$ cm$^{-3}$. The impurity concentration and the thickness of the withstand voltage holding regions 13 and 14 are, for example, $1 \times 10^{13}$ cm$^{-3}$ to $1 \times 10^{18}$ cm$^{-3}$ and 4 μm to 200 μm, respectively, and are appropriately set according to the withstand voltage required.

Next, the p-type well region 15, the n-type source region 16, and the p-type well contact region 17 are formed with use of, for example, a commonly known lithography technique and a commonly known ion injection technique, as shown in FIG. 3. With each of the regions having, for example, a resist or an oxide film processed through photolithography as a mask, for example, the p-type regions are formed through injection of Al ions and the n-type region through injection of N ions. The well region 15 is formed by injecting Al ions so as to set the impurity concentration to about $1\times10^{15}$ cm$^{-3}$ to $1\times10^{18}$ cm$^{-3}$ and the injection depth to 0.3 μm to 2.0 μm, for example. The source region 16 is formed shallower than the well region 15. In addition, the impurity concentration of the source region 16 is made higher than the impurity concentration of the well region 15, and is set to, for example, about $1\times10^{17}$ cm$^{-3}$ to $1\times10^{21}$ cm$^{-3}$. In the well contact region 17, the impurity concentration is, for example, $1\times10^{17}$ cm$^{-3}$ to $1\times10^{21}$ cm$^{-3}$, and the injection depth is set to about 0.3 μm to 1.0 μm, and the well contact region 17 is made electrically connected to the well region 15. It is desirable to form the well contact region 17 at a substrate temperature of 150° C. or more.

Subsequently, annealing is performed by a heat treatment device in an atmosphere of an inert gas such as an Ar gas. The annealing is performed, for example, at a temperature of 1300° C. to 1900° C. for 30 seconds to 1 hour. This annealing activates an n-type impurity such as N and a p-type impurity such as Al that have been ion-injected.

Next, the gate oxide film 21, the gate electrode 22, the interlayer insulating film 23, and the source electrode 24 are sequentially formed as shown in FIG. 4. The gate oxide film 21 is formed by, for example, a thermal oxidation method or a deposition method, and a heat treatment may also be performed in a nitrogen or ammonia atmosphere after those steps. The gate electrode 22 is formed by, for example, depositing polysilicon by a CVD method, and performing etching with a resist processed through photolithography as a mask. Polysilicon may include an impurity such as phosphorus or boron, and low sheet resistance can be realized by including the impurity. The interlayer insulating film 23 is deposited by, for example, a CVD method, and etched so as to expose at least a part of the source region 16, the well contact region 17, and the gate electrode 22 for separate extraction of the gate electrode 22 and the source electrode 24. The wiring of the gate electrode 22 is not shown, however, it is exposed at an outer peripheral portion of the MOSFET, so that the gate electrode 22 and the source electrode 24 can be formed simultaneously in a manner in which the gate electrode 22 and the source electrode 24 are separated from each other. Subsequently, for bringing the source region 16 and the well contact region 17 that have been exposed by etching into ohmic contact with the source electrode 24, for example, a Ni film is formed on the entire substrate and subjected to a heat treatment at 600 to 1000° C. to form a silicide (not shown). The Ni left in the interlayer insulating film 23 is removed by wet etching. Wiring that extracts the gate electrode 22 and the source electrode 24 are formed by depositing Al, Cu, Ti, Ni, Mo, W, Ta, or a metal formed of a nitride, a laminated film, or an alloy layer of those metals by a sputtering method or a vapor deposition method, followed by patterning.

Next, the SiC substrate 11 is removed, and then the n-type contact region 12 is formed under the n-type withstand voltage holding region 13, as shown in FIG. 5. The removal of the SiC substrate 11 is performed by, for example, grinding with use of a commonly known grinding technique, and then removing an affected layer by a commonly known polishing technique as necessary. In the grinding step, a surface of the wafer (a surface on a side opposite to a grinding surface) can be joined with a protective substrate, which is not shown, though, to prevent a crack in the wafer and damage to the surface structure. The protective substrate may be removed after the removal step, or does not have to be removed in a case of a configuration in which an upper portion of the protective substrate can be connected to the source electrode and the gate electrode, respectively.

The n-type contact region 12 is formed by, for example, a commonly known lithography technique and a commonly known ion injection technique. In the contact region, the impurity concentration is set to, for example, about $1\times10^{17}$ cm$^{-3}$ to $1\times10^{21}$ cm$^{-3}$, and the injection depth is determined so that both formation of good ohmic contact and withstand voltage holding during reverse bias can be achieved. Subsequently, selective annealing can be performed with use of not a normal heat treatment device but, for example, a laser annealing device to activate an n-type impurity without giving an influence on the surface structure.

Last, the ohmic electrode 25 and the Schottky electrode 26 are formed under the contact region 12 and the p-type withstand voltage holding region 14, respectively, and further, the drain electrode 27 is formed to complete the silicon carbide semiconductor device 101 shown in FIG. 1. The ohmic electrode 25 and the Schottky electrode 26 are formed by, for example, depositing Al, Cu, Ti, Ni, Mo, W, Ta, or a metal formed of a nitride, a laminated film, or an alloy layer of those metals by a sputtering method or a vapor deposition method. It is possible to simultaneously make the ohmic electrode 25 and the Schottky electrode 26 from an identical electrode material by appropriately controlling the impurity concentration of the p-type withstand voltage holding region 14 and the contact region 12. While an annealing treatment is performed as necessary for forming the Schottky contact and the ohmic contact, for example, the annealing conditions for the ohmic electrode 25 and the Schottky electrode 26 may be made different as necessary with use of a laser annealing technique. The drain electrode 27 is formed by forming a metal film of, for example, Ti, Ni, Ag, or Au by a sputtering method or a vapor deposition method.

A-4. Effects

The silicon carbide semiconductor device 101 according to the embodiment 1 includes the drain electrode 27; the ohmic electrode 25 and the Schottky electrode 26 that are formed in contact with the drain electrode 27 respectively on the drain electrode 27 and are formed next to each other; the first conductivity type withstand voltage holding region 13 (first withstand voltage holding region) in contact with the ohmic electrode on the ohmic electrode 25; the second conductivity type withstand voltage holding region 14 (second withstand voltage holding region) that is in contact with the Schottky electrode on the Schottky electrode 26 and is next to the first withstand voltage holding region; the second conductivity type well region 15 in contact onto the withstand voltage holding region 13 and the withstand voltage holding region 14; the first conductivity type source region 16 selectively provided on a surface layer of the well region 15; and the gate electrode 22 opposite to the channel region defined by the well region 15 sandwiched between the source region 16 and the withstand voltage holding region 13, with the gate oxide film 21 interposed therebetween. Thus, the silicon carbide semiconductor device 101 is made as a parallel connection structure of the SiC-MOSFET and the SiC-SBD to allow a reflux current to be flowed not in the body diode of the MOSFET but in the SBD, so that the defect expansion can be prevented.

According to the manufacturing method for the silicon carbide semiconductor device 101 of the embodiment 1, the first conductivity type withstand voltage holding region 13 (first withstand voltage holding region) and a second conductivity type withstand voltage holding region 14 (second withstand voltage holding region) are formed next to each other on the first conductivity type SiC substrate 11, the second conductivity type well region 15 is formed in contact with the withstand voltage holding region 13 and the withstand voltage holding region 14, the first conductivity type source region 16 is selectively formed on a surface layer of the well region 15, the gate electrode 22 is formed opposite to the channel region defined by the well region sandwiched between the source region 16 and the withstand voltage holding region 13, with the gate oxide film 21 interposed therebetween, the SiC substrate 11 is removed to expose the withstand voltage holding region 13 and the withstand voltage holding region 14, the ohmic electrode 25 is formed in contact with an exposed surface of the withstand voltage holding region 13, and the Schottky electrode 26 is formed in contact with an exposed surface of the withstand voltage holding region 14. Thus, the silicon carbide semiconductor device 101 is formed as a parallel connection structure of the SiC-MOSFET and the SiC-SBD to allow a reflux current to be flowed not in the body diode of the MOSFET but in the SBD, so that the defect expansion can be prevented.

B. Embodiment 2

B-1. Configuration

Figure 6:
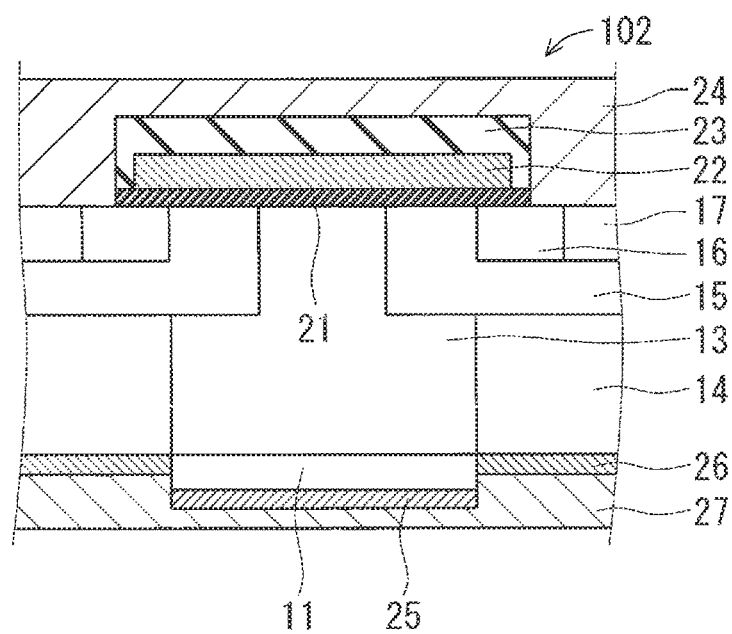
FIG. 6 is a sectional view showing a configuration of a silicon carbide semiconductor device according to an embodiment 2.

FIG. 6 is a sectional view showing a configuration of a silicon carbide semiconductor device 102 according to an embodiment 2. The silicon carbide semiconductor device 102 has a parallel connection structure of an n-channel type SiC-MOSFET and a p-channel type SiC-SBD as in the silicon carbide semiconductor device 101 according to the embodiment 1. The silicon carbide semiconductor device 102, however, is different from the silicon carbide semiconductor device 101 in that the SiC substrate 11 is used instead of the contact region 12.

B-2. Manufacturing Steps

Manufacturing steps of the silicon carbide semiconductor device 102 are described. In the manufacturing steps of the silicon carbide semiconductor device 102, since the steps before the removal of the SiC substrate 11 are the same as the steps described in the embodiment 1 with reference to FIGS. 2 to 4, the description for the steps is omitted.

Figure 7:
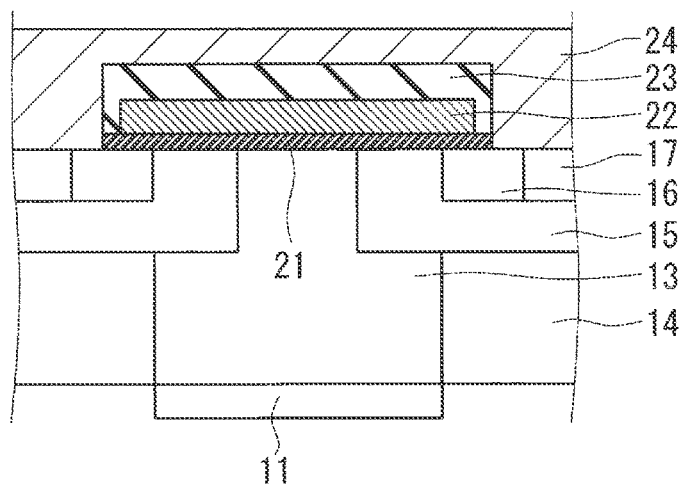
FIG. 7 is a sectional view showing a manufacturing step of the silicon carbide semiconductor device according to the embodiment 2.

In the embodiment 1, the SiC substrate 11 is completely removed from the state shown in FIG. 4. In the embodiment 2, however, the SiC substrate 11 is removed in such a manner as to be left only under the n-type withstand voltage holding region 13, to expose the p-type withstand voltage holding region 14, as shown in FIG. 7. The removal of the SiC substrate 11 is performed by a commonly known selective etching technique. Since the thickness of the SiC substrate 11 is normally as large as about several hundred micrometers, the selective etching may be performed after entirely thinning the SiC substrate to some degree by grinding or polishing. In that case, a difference in level generated by leaving the SiC substrate 11 becomes small, preventing, for example, a crack or the like of the wafer that possibly occurs in the following semiconductor process. For the removal of the SiC substrate 11, a protective substrate may be jointed with the wafer as in the embodiment 1.

With other steps performed as in the embodiment 1, the silicon carbide semiconductor device 102 is completed.

Since the SiC substrate 11 selectively left serves as the contact region 12 in the silicon carbide semiconductor device 102, a lower surface of the SiC substrate 11 is positioned lower than a lower surface of the withstand voltage holding region 14. In other words, a lower surface of the contact region is positioned lower than the lower surface of the withstand voltage holding region 14.

B-3. Effects

The silicon carbide semiconductor device 102 according to the embodiment 2 includes the first conductivity type contact region between the ohmic electrode 25 and the withstand voltage holding region 13 (first withstand voltage holding region) for securing the ohmic contact between the ohmic electrode and the withstand voltage holding region, and the lower surface of the contact region is positioned lower than the lower surface of the withstand voltage holding region 14. According to such a configuration, the SiC substrate 11 is selectively removed, and the SiC substrate 11 left can be made as the contact region 12, making the ion injection step for forming the contact region unnecessary.

According to the manufacturing method for the silicon carbide semiconductor device 102 of the embodiment 2, the first conductivity type first withstand voltage holding region 13 and the second conductivity type second withstand voltage holding region 14 are formed next to each other on the first conductivity type SiC substrate 11, the second conductivity type well region 15 is formed in contact with the first withstand voltage holding region 13 and the second withstand voltage holding region 14, the first conductivity type source region 16 is selectively formed on a surface layer of the well region 15, the gate electrode 22 is formed opposite to the channel region defined by the well region sandwiched between the source region 16 and the first withstand voltage holding region 13, with the gate oxide film 21 interposed therebetween, the SiC substrate 11 is selectively removed not to expose the first withstand voltage holding region 13 but to expose the second withstand voltage holding region 14, the ohmic electrode 25 is formed in contact with the SiC substrate 11, and the Schottky electrode 26 is formed in contact with an exposed surface of the second withstand voltage holding region 14. The ohmic electrode is brought into contact with use of the SiC substrate 11 as described above, making the ion injection step for forming the contact region unnecessary.

C. Embodiment 3

C-1. Configuration

Figure 8:
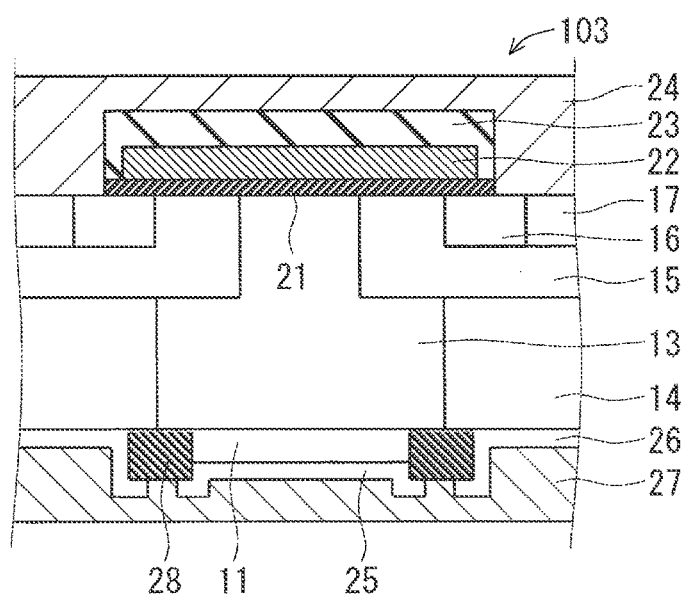
FIG. 8 is a sectional view showing a configuration of a silicon carbide semiconductor device according to an embodiment 3.

FIG. 8 is a sectional view showing a configuration of a silicon carbide semiconductor device 103 according to an embodiment 3. The silicon carbide semiconductor device 103 also has a parallel connection structure of an n-channel type SiC-MOSFET and a p-channel type SiC-SBD as in the silicon carbide semiconductor device 102 according to the embodiment 2. The silicon carbide semiconductor device 103, however, is different from the silicon carbide semiconductor device 102 in that an electric field relieving layer 28 is provided in a region, which joins with the ohmic electrode 25 and the Schottky electrode 26, of a junction region between the withstand voltage holding region 13 and the withstand voltage holding region 14. Specifically, the electric field relieving layer 28 is in contact with the withstand voltage holding region 13, the withstand voltage holding region 14, the ohmic electrode 25, and the Schottky electrode 26.

For the electric field relieving layer 28, for example, an insulating film of SiO2 or the like is used. In the silicon carbide semiconductor devices 101 and 102 according to the embodiments 1 and 2, when a high voltage is applied to the drain electrode 27 at OFF-time, concentration of an electric field may possibly occur in a region around the ohmic electrode 25 and the Schottky electrode 26 of a junction portion between the withstand voltage holding regions 13 and 14. Therefore, in the silicon carbide semiconductor device 103, the electric field relieving layer can be inserted in the region to suppress such concentration of an electric field.

In FIG. 8, the configuration is such that the ohmic electrode 25 and the Schottky electrode 26 run on the electric field relieving layer 28, and the configuration gives further electric field relief by a field plate effect.

In the semiconductor device 103, the SiC substrate 11 is partially left as in the embodiment 2, while the SiC substrate 11 may be completely removed and the contact region 12 may be formed as in the embodiment 1.

C-2. Manufacturing Steps

Next, a manufacturing method for the silicon carbide semiconductor device 103 is described. In manufacturing steps of the silicon carbide semiconductor device 102 according to the embodiment 2, the SiC substrate 11 is selectively removed to expose a portion in contact with the p-type withstand voltage holding region 14 of the n-type withstand voltage holding region 13, and the p-type withstand voltage holding region 14.

Subsequently, SiO2 is formed by, for example, CVD, and further, unnecessary SiO2 is removed by a commonly known lithography technique and a commonly known etching technique, to form the electric field relieving layer 28 at the junction portion between the withstand voltage holding regions 13 and 14.

Subsequently, the ohmic electrode 25 and the Schottky electrode 26 are formed under the SiC substrate 11 and the p-type withstand voltage holding region 14, respectively, and further, the drain electrode 27 is formed, as in the embodiment 2. In this regard, the ohmic electrode 25 and the Schottky electrode 26 are formed so as to overlap the electric field relieving layer 28.

C-3. Effects

The silicon carbide semiconductor device 103 according to the embodiment 3 includes the electric field relieving layer 28 (insulating layer) in contact with the withstand voltage holding region 13 (first withstand voltage holding region), the withstand voltage holding region 14 (second withstand voltage holding region), the ohmic electrode (25), and the Schottky electrode (26). Accordingly, when a high voltage is applied to the drain electrode 27 at OFF-time, the concentration of an electric field can be relieved in a region around the ohmic electrode 25 and the Schottky electrode 26 of the junction portion between the withstand voltage holding regions 13 and 14.

D. Embodiment 4

D-1. Configuration

Figure 9:
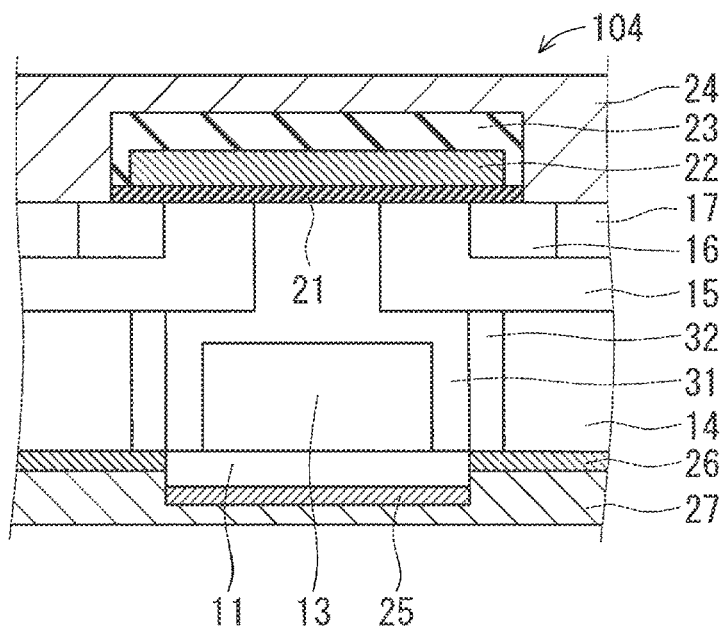
FIG. 9 is a sectional view showing a configuration of a silicon carbide semiconductor device according to an embodiment 4.

FIG. 9 is a sectional view showing a configuration of a silicon carbide semiconductor device 104 according to an embodiment 4. The silicon carbide semiconductor device 104 is different from the silicon carbide semiconductor device 102 according to the embodiment 2 in that electric field relieving regions 31 and 32 having a low impurity concentration are inserted in a region where PN junction between the n-type withstand voltage holding region 13 and the p-type withstand voltage holding region 14 is formed (hereinafter, referred to as a PN junction portion). The configuration other than that, however, is the same as in the silicon carbide semiconductor device 102.

In an N-type region of the PN junction portion, the electric field relieving region 31 is inserted which has an n-type impurity concentration lower than that of the n-type withstand voltage holding region 13. In a P-type region of the PN junction portion, the electric field relieving region 32 is inserted which has a p-type impurity concentration lower than that of the p-type withstand voltage holding region 14. Accordingly, assuming that the electric field relieving regions 31 and 32 are the withstand voltage holding regions, it can be restated that the withstand voltage holding regions each have a distribution in which the impurity concentration is lower at the PN junction portion than in other regions. It can also be said that the withstand voltage holding region 13 has a lower impurity concentration at a region on a side in contact with the withstand voltage holding region 14 than in other regions, and the withstand voltage holding region 14 has a lower impurity concentration at a region on a side in contact with the withstand voltage holding region 13 than in other regions.

With the configuration described above, the concentration of an electric field can be relieved at the PN junction portion when a high voltage is applied to the drain electrode 27. With the impurity concentration at the PN junction portion lowered, the voltage at which a PN diode current flows becomes large, further suppressing the PN diode current.

D-2. Manufacturing Steps

Figure 10:
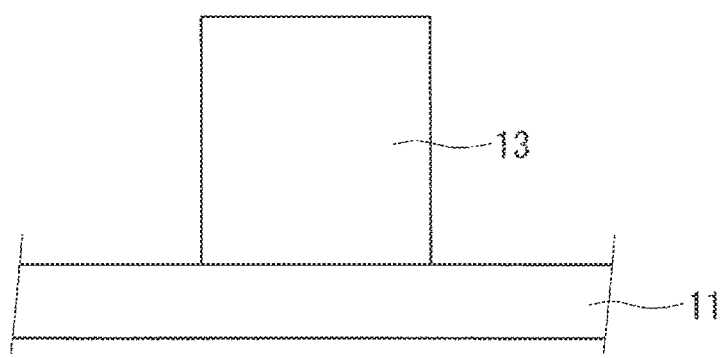
FIG. 10 is a sectional view showing a manufacturing step of the silicon carbide semiconductor device according to the embodiment 4.
Figure 11:
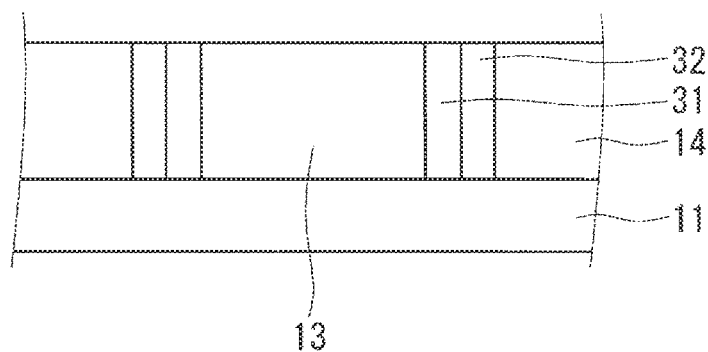
FIG. 11 is a sectional view showing a manufacturing step of the silicon carbide semiconductor device according to the embodiment 4.
Figure 12:
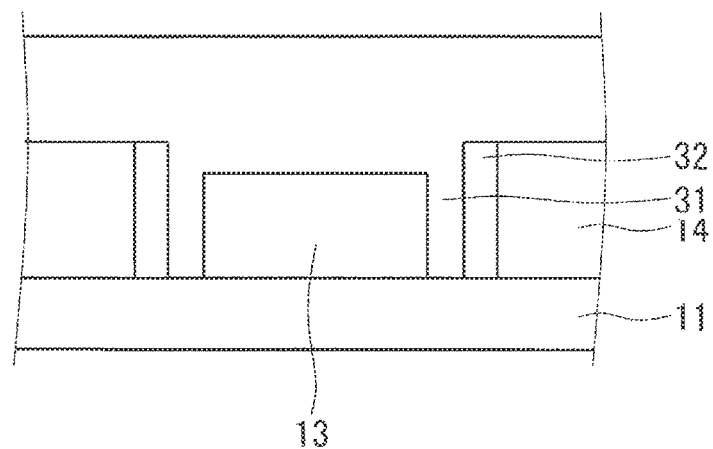
FIG. 12 is a sectional view showing a manufacturing step of the silicon carbide semiconductor device according to the embodiment 4.

Manufacturing steps of the silicon carbide semiconductor device 104 are described along with FIGS. 10 to 12. First, the n-type withstand voltage holding region 13 is formed on the n-type low resistance SiC substrate 11. The withstand voltage holding region 13 is formed on the entire surface of the SiC substrate 11, and is then selectively etched as shown in FIG. 10.

Next, the n-type electric field relieving region 31, the p-type electric field relieving region 32, and the p-type withstand voltage holding region 14 are formed with use of, for example, a commonly known lithography technique and a commonly known ion injection technique, as shown in FIG. 11.

Then, the withstand voltage holding region 13 is etched to a certain depth to provide a difference in level between an upper surface of the withstand voltage holding region 13 and an upper surface of the electric field relieving region 31. Then, the electric field relieving region 31 is formed on the entire surface of the wafer as shown in FIG. 12.

Subsequently, with the same steps performed as in the embodiment 2, the silicon carbide semiconductor device 104 having a structure shown in FIG. 9 is completed.

As a semiconductor device including the electric field relieving regions 31 and 32 in addition to the configuration of the silicon carbide semiconductor device 102, the silicon carbide semiconductor device 104 has been described, however, the present embodiment is also applicable to the configurations of the embodiments 1 and 3.

D-3. Effects

In the silicon carbide semiconductor device 104 according to the embodiment 4, the withstand voltage holding region 13 (first withstand voltage holding region) has a lower impurity concentration at a region on a side in contact with the withstand voltage holding region 14 (second withstand voltage holding region) than in other regions, and the second withstand voltage holding region 14 has a lower impurity concentration at a region on a side in contact with the first withstand voltage holding region 13 than in other regions. Accordingly, the concentration of an electric field can be relieved when a high voltage is applied to the drain. With a low impurity concentration at the PN junction portion, the voltage at which a PN diode current flows becomes large, further suppressing the PN diode current.

E. Embodiment 5

E-1. Configuration, Manufacturing Method

FIG. 13 is a sectional view showing a configuration of a silicon carbide semiconductor device 105 according to an embodiment 5. In the silicon carbide semiconductor device 105, an electric field relieving region is formed around a junction surface between the n-type withstand voltage holding region 13 and the p-type withstand voltage holding region 14, specifically, at the PN junction portion and its lower portion (drain electrode side), specifically, around a junction surface between the junction portion and the Schottky electrode 26 or the SiC substrate 11.

Specifically, a p-type electric field relieving region 34 is partially formed at the PN junction portion of the n-type withstand voltage holding region 13, and an n-type electric field relieving region 33 is partially formed at the PN junction portion of the p-type withstand voltage holding region 14. The configuration of the silicon carbide semiconductor device 105 other than this is the same as the configuration of the silicon carbide semiconductor device 102 according to the embodiment 2.

The electric field relieving regions 33 and 34 can be formed by selectively removing the SiC substrate 11 and then using, for example, a commonly known lithography technique and a commonly known ion injection technique in the manufacturing steps of the silicon carbide semiconductor device 102. The impurity concentration of the electric field relieving regions 33 and 34 is made lower than that of the SiC substrate 11 but higher than that of the withstand voltage holding regions 13 and 14.

E-2. Effects

The silicon carbide semiconductor device 105 according to the embodiment 5 includes, on a side of the drain electrode 27 of the pn junction portion between the withstand voltage holding region 13 (first withstand voltage holding region) and the withstand voltage holding region 14 (second withstand voltage holding region), the second conductivity type electric field relieving region 34 (first electric field relieving region) in the withstand voltage holding region 13 and the first conductivity type electric field relieving region 33 (second electric field relieving region) in the withstand voltage holding region 14, respectively. Thereby, the concentration of an electric field can be suppressed on a side of the drain electrode 27 of the pn junction portion between the withstand voltage holding regions 13 and 14 when a high voltage is applied to the drain electrode 27 at OPP-time.

As a semiconductor device including the electric field relieving regions 33 and 34 in addition to the configuration of the silicon carbide semiconductor device 102, the silicon carbide semiconductor device 105 has been described, however, the present embodiment is also applicable to the configurations of the embodiments 1, 3, and 4.

The present invention has been described in detail, however, the descriptions above are examples in all the aspects, and the present invention is not limited to the examples. It is to be understood that numerous modified examples not exemplified are assumed to be included in the present invention without falling outside the range of the present invention.

REFERENCE SIGNS LIST

11: SiC substrate
12: contact region
13, 14: withstand voltage holding region
15: well region
16: source region
17: well contact region
21: gate oxide film
22: gate electrode
23: interlayer insulting film
24: source electrode
25: ohmic electrode
26: Schottky electrode
27: drain electrode
28: electric field relieving layer
31, 32, 33, 34: electric field relieving region
101, 102, 103, 104, 105: silicon carbide semiconductor device

The invention claimed is:

1. A silicon carbide semiconductor device comprising:
a drain electrode;
an ohmic electrode and a Schottky electrode that are in contact with said drain electrode respectively on said drain electrode and are next to each other;
a first conductivity type first withstand voltage holding region in contact with said ohmic electrode on said ohmic electrode;
a second conductivity type second withstand voltage holding region that is in contact with said Schottky electrode on said Schottky electrode and is next to said first withstand voltage holding region;
a second conductivity type well region in contact onto said first withstand voltage holding region and said second withstand voltage holding region;
a first conductivity type source region selectively provided on a surface layer of said well region; and
a gate electrode opposite to a channel region defined by said well region sandwiched between said source region and said first withstand voltage holding region, with a gate oxide film interposed therebetween; and
further comprising an insulating layer in direct contact with said first withstand voltage holding region, said second withstand voltage holding region, said ohmic electrode, and said Schottky electrode.

2. The silicon carbide semiconductor device according to claim 1 further comprising a first conductivity type contact region between said ohmic electrode and said first withstand voltage holding region for securing ohmic contact between the ohmic electrode and the first withstand voltage holding region, wherein
a lower surface of said contact region is positioned lower than a lower surface of said second withstand voltage holding region.

3. A silicon carbide semiconductor device comprising:
a drain electrode;
an ohmic electrode and a Schottky electrode that are in contact with said drain electrode respectively on said drain electrode and are next to each other;
a first conductivity type first withstand voltage holding region in contact with said ohmic electrode on said ohmic electrode;
a second conductivity type second withstand voltage holding region that is in contact with said Schottky electrode on said Schottky electrode and is next to said first withstand voltage holding region;
a second conductivity type well region in contact onto said first withstand voltage holding region and said second withstand voltage holding region;
a first conductivity type source region selectively provided on a surface layer of said well region; and
a gate electrode opposite to a channel region defined by said well region sandwiched between said source region and said first withstand voltage holding region, with a gate oxide film interposed therebetween, wherein
said first withstand voltage holding region has a lower impurity concentration at a region on a side in contact with said second withstand voltage holding region and across an interface formed by the lower impurity concentration region with the gate oxide than in other regions, and
said second withstand voltage holding region has a lower impurity concentration at a region on a side in contact with said first withstand voltage holding region than in other regions.

4. A silicon carbide semiconductor device comprising:
a drain electrode;
an ohmic electrode and a Schottky electrode that are in contact with said drain electrode respectively on said drain electrode and are next to each other;
a first conductivity type first withstand voltage holding region in contact with said ohmic electrode on said ohmic drain electrode;
a second conductivity type second withstand voltage holding region that is in contact with said Schottky electrode on said Schottky electrode and is next to said first withstand voltage holding region;
a second conductivity type well region in contact onto said first withstand voltage holding region and said second withstand voltage holding region;
a first conductivity type source region selectively provided on a surface layer of said well region;
a gate electrode opposite to a channel region defined by said well region sandwiched between said source region and said first withstand voltage holding region, with a gate oxide film interposed therebetween;
a pn junction formed between said first withstand voltage holding region and said second withstand voltage holding region in a region proximate to said drain electrode;
a second conductivity type first electric field relieving region in said first withstand voltage holding region in said region proximate to said drain electrode; and
a first conductivity type second electric field relieving region in said second withstand voltage holding region in said region proximate to said drain electrode.

5. The silicon carbide semiconductor device according to claim 3 further comprising a first conductivity type contact region between said ohmic electrode and said first withstand voltage holding region for securing ohmic contact between the ohmic electrode and the first withstand voltage holding region, wherein
a lower surface of said contact region is positioned lower than a lower surface of said second withstand voltage holding region.

6. The silicon carbide semiconductor device according to claim 4 further comprising a first conductivity type contact region between said ohmic electrode and said first withstand voltage holding region for securing ohmic contact between the ohmic electrode and the first withstand voltage holding region, wherein
a lower surface of said contact region is positioned lower than a lower surface of said second withstand voltage holding region.

* * * * *